United States Patent
Wang et al.

(10) Patent No.: US 7,562,326 B2
(45) Date of Patent: Jul. 14, 2009

(54) METHOD OF GENERATING A STANDARD CELL LAYOUT AND TRANSFERRING THE STANDARD CELL LAYOUT TO A SUBSTRATE

(75) Inventors: Wei-Jen Wang, Tainan County (TW); Chen-Hsien Hsu, Hsinchu County (TW); Chien-Kuo Wang, Hsin-Chu (TW); Dar-Sun Tsien, Los Altos, CA (US)

(73) Assignee: United Microelectronics Corp., Hsin-Chu (TW)

( * ) Notice: Subject to any disclaimer, the term of this patent is extended or adjusted under 35 U.S.C. 154(b) by 104 days.

(21) Appl. No.: 11/836,774

(22) Filed: Aug. 9, 2007

(65) Prior Publication Data

US 2009/0044163 A1    Feb. 12, 2009

(51) Int. Cl.
 *G06F 17/50* (2006.01)
(52) U.S. Cl. .................. 716/9; 716/8; 716/10; 716/11; 716/17
(58) Field of Classification Search ............... 716/8–11, 716/17
See application file for complete search history.

(56) References Cited

U.S. PATENT DOCUMENTS

| | | | | |
|---|---|---|---|---|
| 5,612,893 A | * | 3/1997 | Hao et al. ....................... | 716/2 |
| 5,984,510 A | * | 11/1999 | Guruswamy et al. ........... | 716/2 |
| 6,067,409 A | * | 5/2000 | Scepanovic et al. ............ | 716/8 |
| 6,223,330 B1 | * | 4/2001 | Risler ............................ | 716/8 |
| 6,539,533 B1 | * | 3/2003 | Brown et al. .................. | 716/17 |
| 6,938,226 B2 | * | 8/2005 | Nguyen et al. ................. | 716/1 |
| 7,178,122 B2 | * | 2/2007 | Kishibe ....................... | 716/10 |
| 7,325,214 B2 | * | 1/2008 | Liao ............................ | 716/11 |
| 7,441,211 B1 | * | 10/2008 | Gupta et al. ................... | 716/2 |
| 7,469,389 B2 | * | 12/2008 | Namba et al. .................. | 716/1 |
| 2004/0229135 A1 | * | 11/2004 | Wang et al. .................... | 430/5 |
| 2005/0229142 A1 | * | 10/2005 | Boppana et al. ............... | 716/17 |
| 2007/0083842 A1 | * | 4/2007 | Namba et al. ................. | 716/17 |
| 2007/0113216 A1 | * | 5/2007 | Zhang ......................... | 716/17 |
| 2007/0157151 A1 | * | 7/2007 | Kim ............................ | 716/17 |

\* cited by examiner

*Primary Examiner*—Naum B Levin
(74) *Attorney, Agent, or Firm*—Winston Hsu

(57) ABSTRACT

A method of generating a standard cell layout includes analyzing a circuit of a standard cell layout and obtaining an analysis result, selecting a plurality of leaf cell layout according to the analysis result, and piecing together the leaf cell layouts to generate the standard cell layout.

13 Claims, 25 Drawing Sheets

METHOD OF GENERATING A STANDARD CELL LAYOUT AND TRANSFERRING THE STANDARD CELL LAYOUT TO A SUBSTRATE

BACKGROUND OF THE INVENTION

1. Field of the Invention

The present invention relates to a method of generating a standard cell layout, and more particularly, to a method that pieces together a plurality of leaf cell layouts to form a standard cell layout.

2. Description of the Prior Art

Standard cells e.g. logic cells are indispensable in integrated circuits. Currently, the layout of each particular standard cell is created manually. However, there are hundreds of different types of standard cells, and therefore it is time-consuming to create a standard cell layout library in which the layouts of all different types of standard cells are collected.

With the emergence of new functionality and the advance of semiconductor fabrication technology, new standard cells are designed unceasingly and the original standard cell layouts have to be modified. According to the conventional layout generation method, every new standard cell layout or an original standard cell layout having a minor modification has to be created manually, which is a time-consuming task.

SUMMARY OF THE INVENTION

It is therefore one of the objective of the present invention to provide a method of generating a standard cell layout to reduce layout creation time and improve efficiency.

According to an embodiment of the present invention, a method of generating a standard cell layout is provided. A circuit of a standard cell layout is analyzed, and an analysis result is obtained. Subsequently, a plurality of leaf cell layout is selected according to the analysis result. Following that, the leaf cell layouts are pieced together to generate the standard cell layout.

According to another embodiment of the present invention, a method of generating a standard cell layout is provided. A circuit of a standard cell layout is analyzed, and an analysis result is obtained. Subsequently, a plurality of leaf cell layout is selected according to the analysis result. Following that, the leaf cell layouts are pieced together to generate the standard cell layout. Then, at least a routing process is performed.

The method of the present invention uses a plurality of simple leaf cell layouts to form a complicate standard cell layout, thereby reducing layout creation time and improving efficiency. The method of the present invention is also advantageous because the standard cell layout area is reduced compared with conventional standard cell layout area.

These and other objectives of the present invention will no doubt become obvious to those of ordinary skill in the art after reading the following detailed description of the preferred embodiment that is illustrated in the various figures and drawings.

DETAILED DESCRIPTION

On of the spirit of the present invention is to use a plurality of simple leaf cell layouts to form a complicate standard cell layout. According to the method of the present invention, plurality types of leaf cell layouts capable of making up different standard cell layouts are collected in a leaf cell layout library as a database. In case a particular standard cell layout is required, a plurality of leaf cell layouts are selected from the leaf cell layout library and combined to complete the particular standard cell layout.

Figure 1:
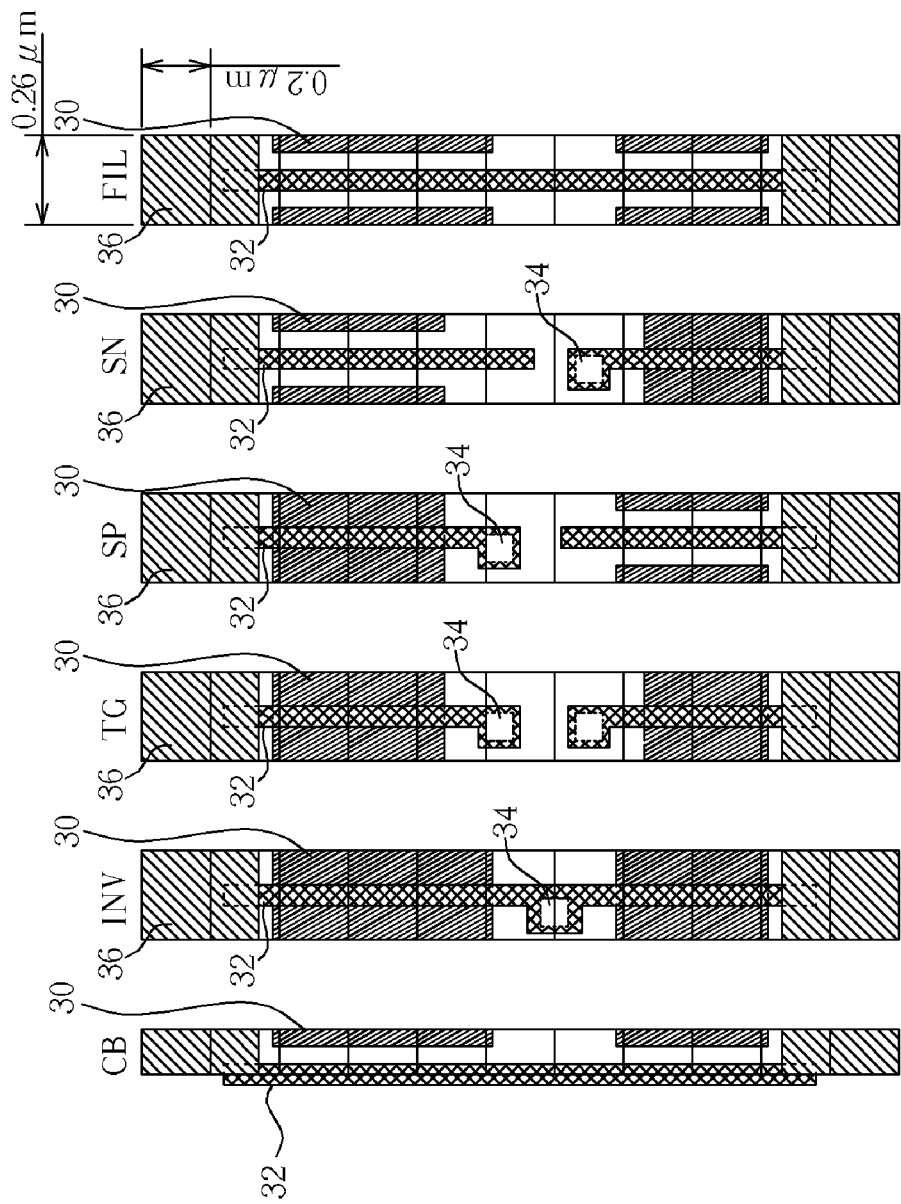
FIG. 1 is a schematic diagram illustrating examples of leaf cell layouts of the present invention.

Please refer to FIG. 1. FIG. 1 is a schematic diagram illustrating examples of leaf cell layouts of the present invention. As shown in FIG. 1, each of the leaf cell layouts according to the present invention is a rectangle (also referred to a track) having a long axis and a short axis. When making up a particular standard cell layout, the selected leaf cell layouts are arranged along the short axis. The leaf cell layout normally includes several layers of overlapping layout patterns e.g. a diffusion pattern 30, a polycrystalline silicon (poly) pattern 32, a contact via pattern 34, a first-layered metal pattern 36, but not limited to. In addition, each leaf cell layout includes a plurality of superimposed grids arranged along the long axis as a coordinate. These grids include a plurality of intersection points, and these intersection points are configured for the convenience of successive auto placing and routing (APR) process to be performed. It is better for the APR apparatus to have more intersection points to select. However, when defining the dimension of the grid, all design rules e.g. poly design rule, metal design rule, diffusion design rule have to be fulfilled. In the embodiments of the present invention, 65-nanometer process is taken as an example. Accordingly, the width of the grid is set 0.26 microns and the length of the grid 0.2 microns. However, the dimension of the grid may be modified wherever necessary. In addition, the leaf cell layouts in the embodiments of the present invention are poly pitch based. This means the polycrystalline silicon pattern 32 of each leaf cell layout is disposed centrally in each leaf cell layout and any two adjacent polycrystalline silicon patterns 32 are substantially equally-spaced along the short axis when the leaf cell layouts are combined. This facilitates the photolithography process of polycrystalline silicon pattern. However, the method of the present invention is not limited to poly pitch based, and other design base e.g. metal pitch based may be used.

The leaf cell layouts may be classified into a first group and a second group. The leaf cell layouts of the first group are main leaf cell layouts, and each of which has the same width and length. The width of leaf cell layout of the first group equals the width of the grid. The leaf cell layouts of the first group normally may implement a certain electrical function or isolate two adjacent leaf cell layouts that cannot be coupled together. The leaf cell layouts of the first group are, for example, a single PMOS leaf cell layout SP, a single NMOS leaf cell layout SN, a transmission gate leaf cell layout TG, a filler (isolator) leaf cell layout FIL, an inverter leaf cell layout INV, etc. The leaf cell layouts of the second group are cell boundary leaf cell layouts CB, which are normally disposed on both sides of the main leaf cell layouts to define the boundary of the standard cell layout. It is appreciated that the leaf cell layout of the second group has the same length as the leaf cell layout of the first group, but the width of the leaf cell layout of the second group is substantially half of the width of the leaf cell layout of the first group. This means the width of the leaf cell layout of the second group is also half of the width of the grid.

Figure 2:
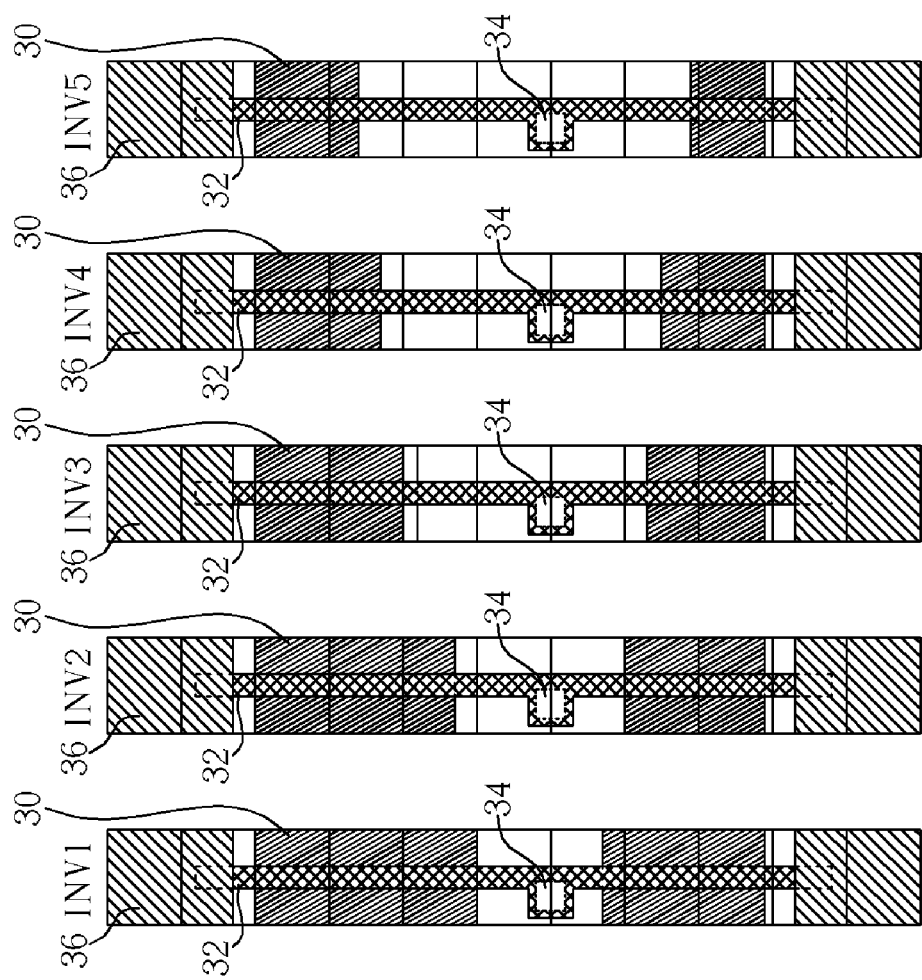
FIG. 2 is a schematic diagram illustrating leaf cell layouts with variant sizes.

Please refer to FIG. 2. FIG. 2 is a schematic diagram illustrating leaf cell layouts with variant sizes. As shown in FIG. 2, five inverter leaf cell layouts INV are drawn. The inverter leaf cell layouts have similar arrangements, but the sizes of the diffusion patterns 30 are different. The inverter cell layouts can be selected depending on different requirement such as different current requirement.

Figure 3:
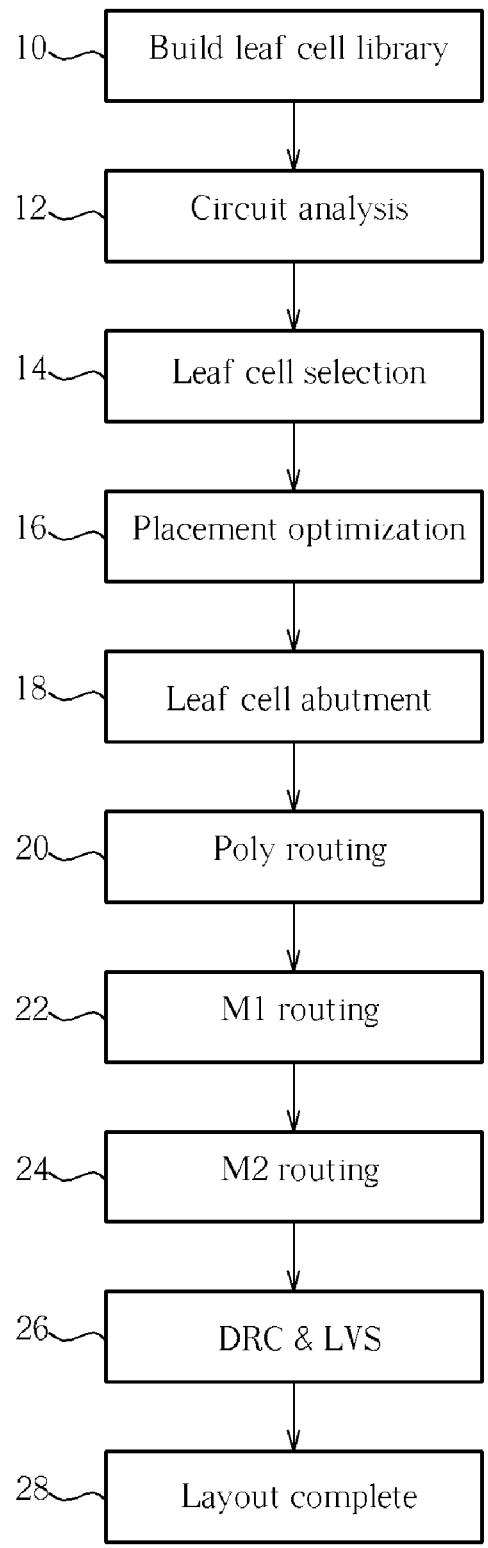
FIG. 3 is a flow chart illustrating a method of generating a standard cell layout according to an embodiment of the present invention.

Please refer to FIG. 3. FIG. 3 is a flow chart illustrating a method of generating a standard cell layout according to an embodiment of the present invention. As shown in FIG. 3, the method of the present invention includes the following steps:

Step 10: Build a leaf cell library.
Step 12: Analyze a circuit of a standard cell layout to be generated, and obtain an analysis result showing which leaf cell layouts may make up the standard cell layout.
Step 14: Select the plurality of leaf cell layouts from the leaf cell layout library according to the analysis result.
Step 16: Optimize the placement of the selected leaf cell layouts.
Step 18: Abutting the selected leaf cell layouts.
Step 20: Perform poly routing.
Step 22: Perform M1 routing.
Step 24: Perform M2 routing.
Step 26: Perform Design rule check (DRC) and layout vs. schematic (LVS).
Step 28: Standard cell layout complete.

Figure 4:
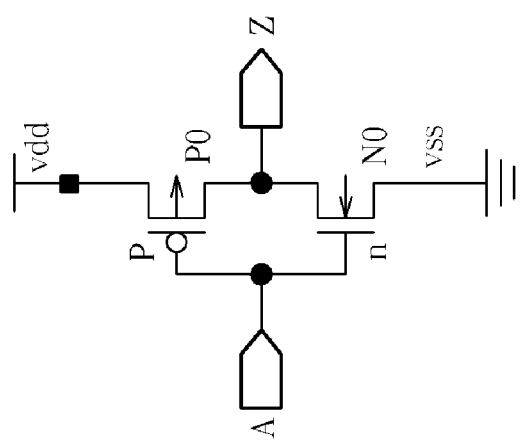
FIG. 4 is a circuit diagram of an inverter cell.
Figure 5:
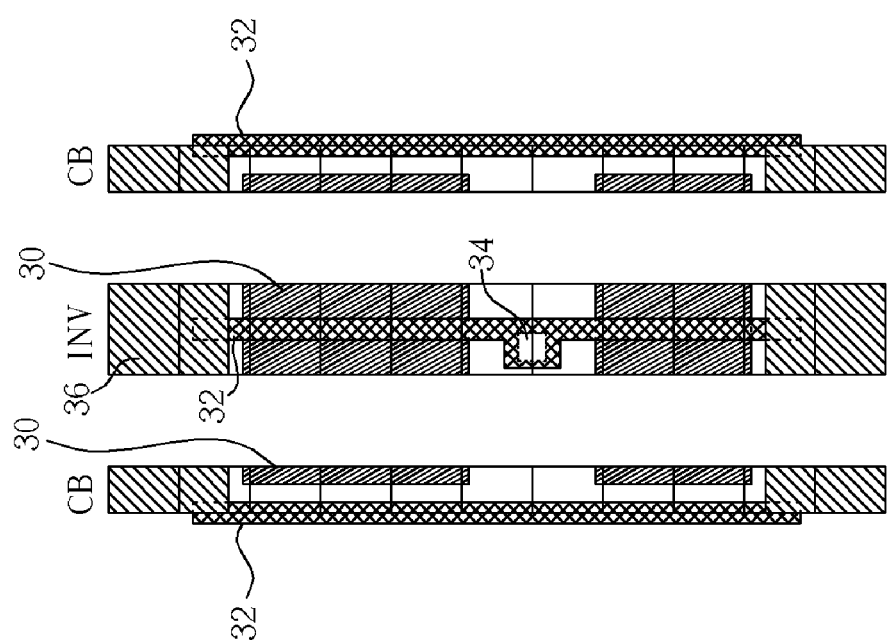
FIGS. 5-6 illustrate a method of generating the layout of the inverter cell of FIG. 4.
Figure 6:
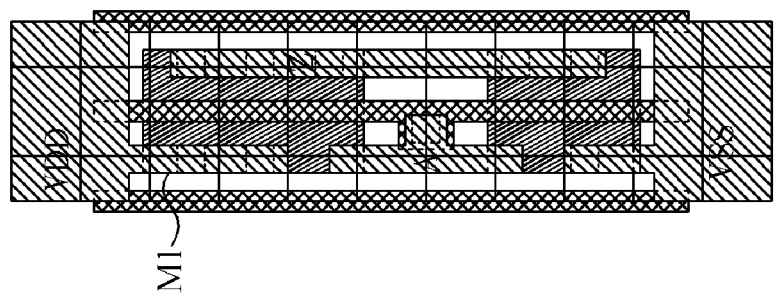

Please refer to FIGS. 4-6. FIG. 4 is a circuit diagram of an inverter cell and FIGS. 5-6 illustrate a method of generating the layout of the inverter cell of FIG. 4. In order to generate the layout of the inverter cell, the circuit of the inverter cell as shown in FIG. 4 is analyzed in advance by searching the leaf cell layout library to know which leaf cell layouts can be used to complete the layout of the inverter cell.

As shown in FIG. 5, in this case an inverter leaf cell layout INV and two cell boundary leaf cell layouts CB are selected according to the analysis result to make up the layout of the inverter cell. The inverter leaf cell layout INV includes a diffusion pattern 30, a polycrystalline silicon pattern 32, a contact via pattern 34, and a first-layered metal pattern 36. The cell boundary leaf cell layout includes a diffusion pattern 30, a polycrystalline silicon pattern 32, and a first-layered metal pattern 36. The placement of the cell boundary leaf cell layouts CB and the inverter leaf cell layout INV are then optimized by disposing the inverter leaf cell layout INV in between the two cell boundary leaf cell layouts CB.

As shown in FIG. 6, the cell boundary leaf cell layouts CB and the inverter leaf cell layout INV are then abutted (combined together). Subsequently, at least a routing process is performed. The routing process may include poly routing using the polycrystalline silicon pattern 32, M1 routing using the first-layered metal pattern 36, and M2 routing using a second-layered metal pattern to be laid. It is appreciated that if poly routing is required, adjustment may have to be made to the polycrystalline silicon pattern 32. If M1 routing is required, the first-layered metal pattern 36 requires to be modified for routing. If the standard cell layout is complicated, M2 routing which uses a second-layered metal pattern may be required. In the instance case, the layout of the inverter cell is not complicated, and thus only M1 routing is used. It is also appreciated that the contact via pattern 34 may have to be modified in accordance with the M1 routing.

Subsequently, DRC and LVS verification are run. The DRC ensures that the layout passes through the rules designed for faultless fabrication. The LVS verification compares the connection of the layout with that of the schematic and ensures that it is really a layout for an inverter cell.

Figure 7:
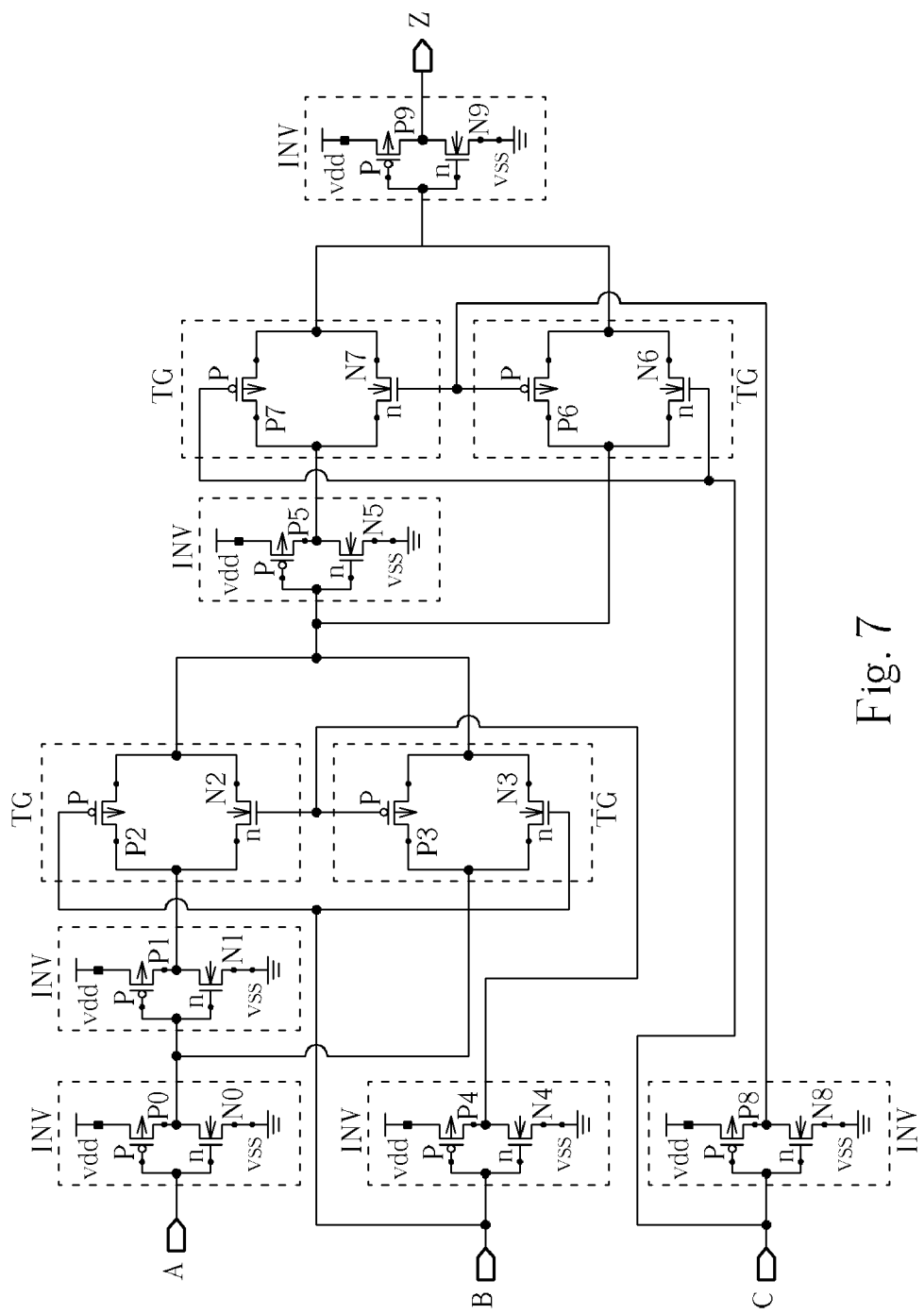
FIG. 7 is a circuit diagram of a multiplexer cell.

Please refer to FIGS. 7-13. FIG. 7 is a circuit diagram of a multiplexer cell, and FIGS. 8-13 are schematic diagrams illustrating a method of generating the layout of the multiplexer cell of FIG. 7 according to the present invention. The circuit of the multiplexer cell as shown in FIG. 7 is analyzed in advance by searching the leaf cell layout library to know which leaf cell layouts can be used to complete the layout of the multiplexer cell.

Figure 8:
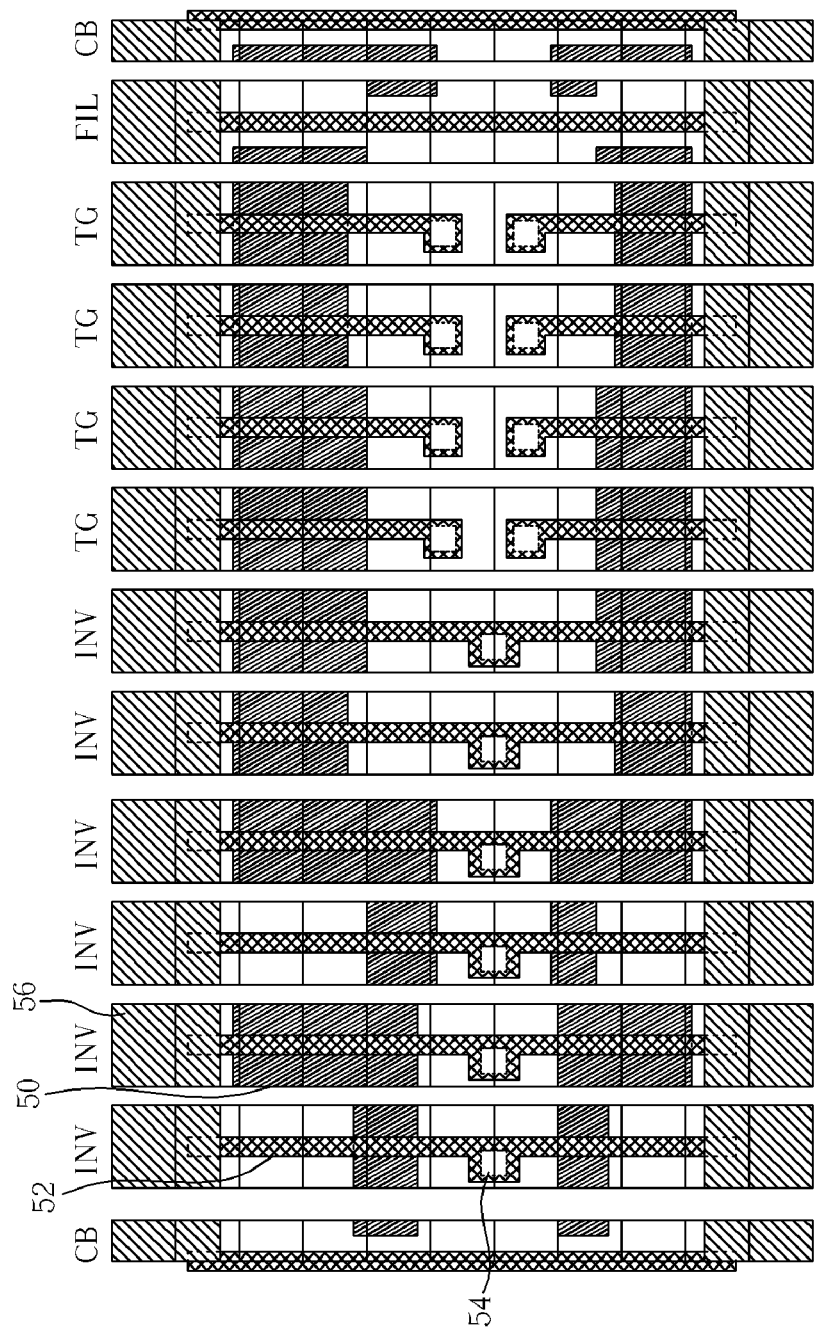
FIGS. 8-13 are schematic diagrams illustrating a method of generating the layout of the multiplexer cell of FIG. 7.

As shown in FIG. 8, in this case six inverter leaf cell layouts INV, four transmission gate leaf cell layouts TG, one filler (isolation) leaf cell layout FIL, and two cell boundary leaf cell layouts CB are selected according to the analysis result to make up the layout of the multiplexer cell. The inverter leaf cell layout INV includes a diffusion pattern 50, a polycrystalline silicon pattern 52, a contact via pattern 54, and a first-layered metal pattern 56. The transmission gate leaf cell layout includes a diffusion pattern 50, a polycrystalline silicon pattern 52, a contact via pattern 54, and a first-layered metal pattern 56. The filler leaf cell layout includes a diffusion pattern 50, a polycrystalline silicon pattern 52, and a first-layered metal pattern 56. The cell boundary leaf cell layout includes a diffusion pattern 50, a polycrystalline silicon pattern 52, and a first-layered metal pattern 56.

Figure 9:
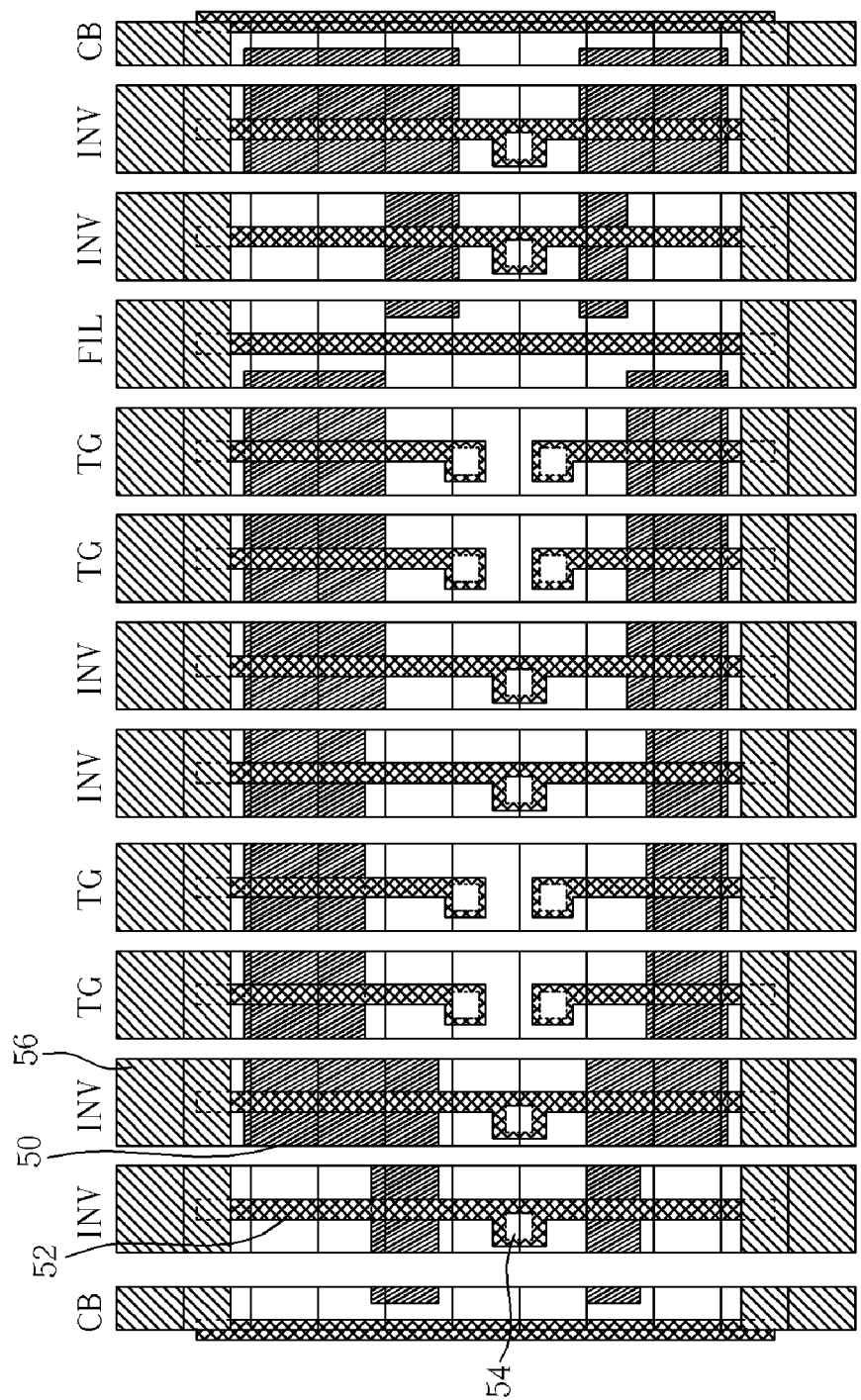
Figure 10:
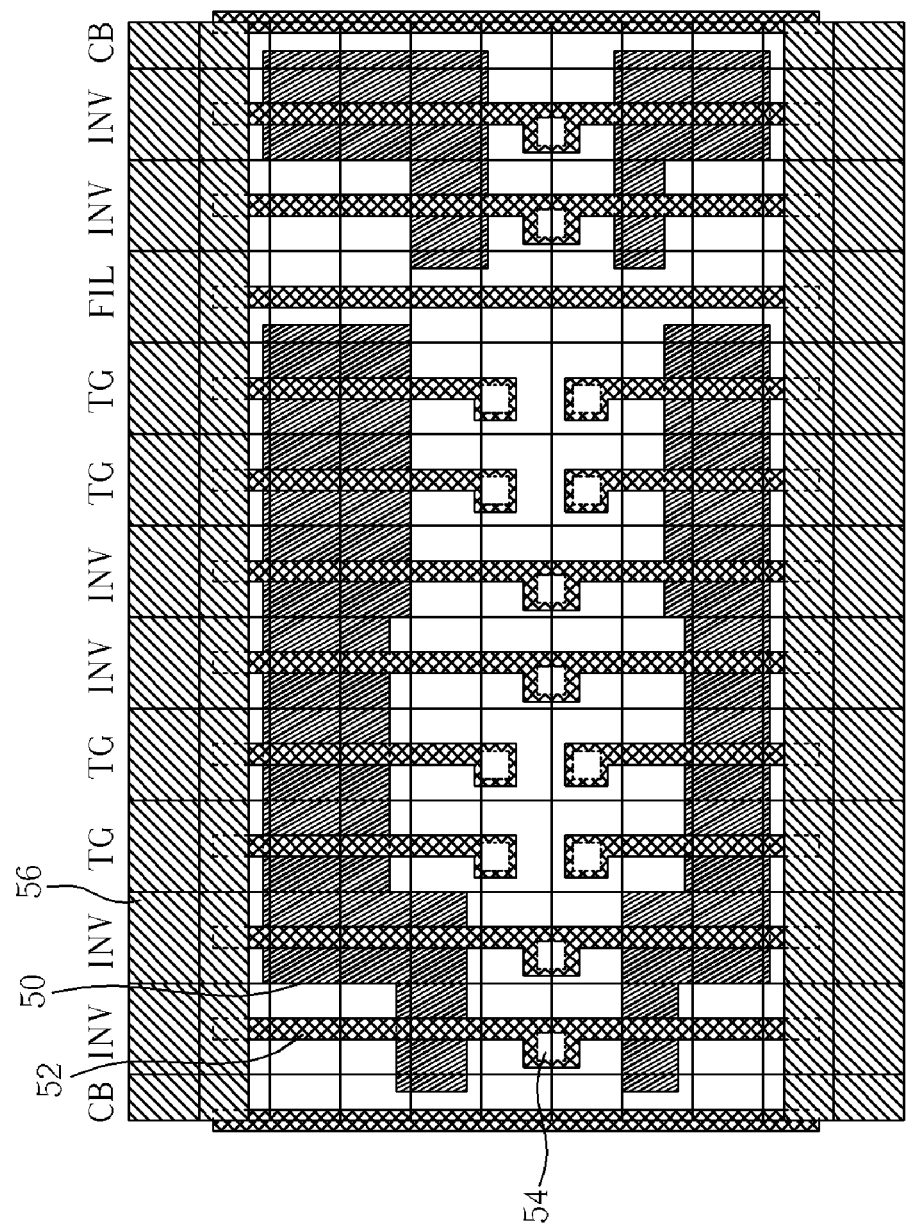

The placement of the leaf cell layouts are then optimized to arrange the cell boundary leaf cell layouts CB, the inverter leaf cell layouts INV, the transmission gate leaf cell layouts TG, and the filler leaf cell layout FIL as shown in FIG. 9. As shown in FIG. 10, the cell boundary leaf cell layouts CB, the inverter leaf cell layouts INV, the transmission gate leaf cell layouts TG, and the filler leaf cell layout FIL are then abutted.

Figure 11:
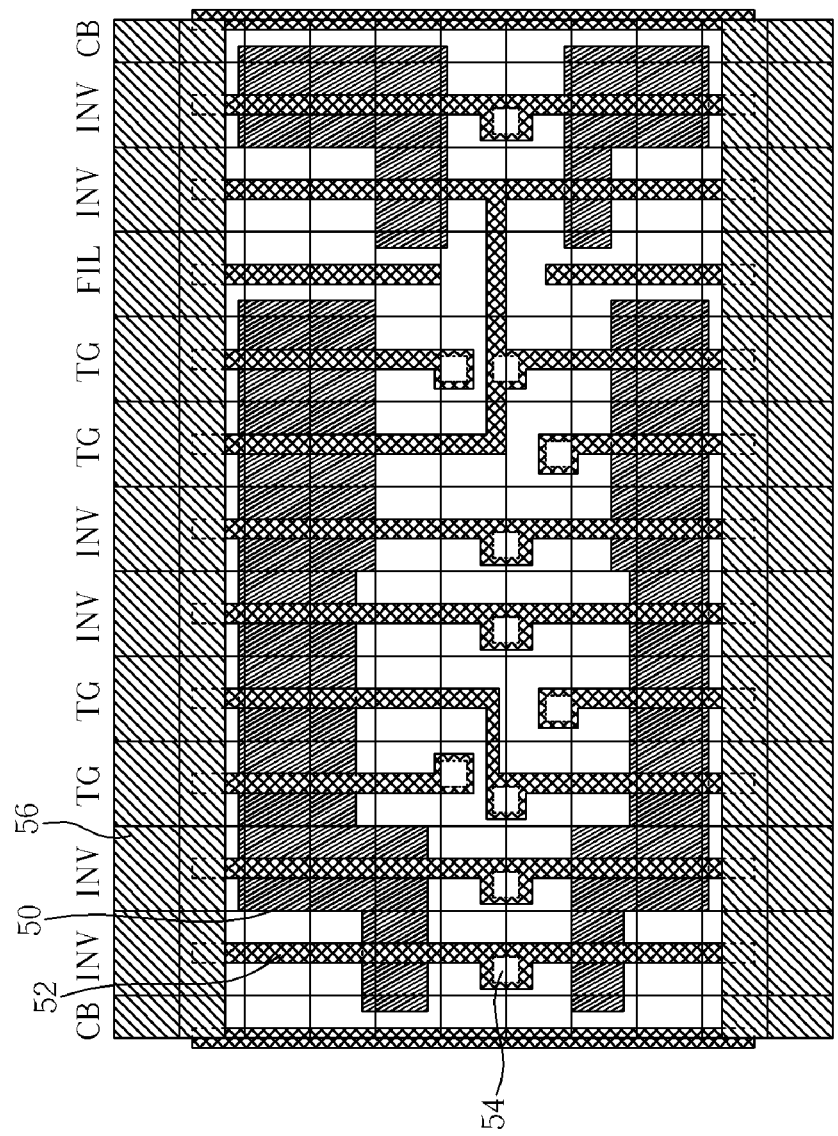

As shown in FIG. 11, a poly routing process using the polycrystalline silicon pattern 50 is performed. The polycrystalline silicon patterns 50 of some leaf cell layouts are slightly altered wherever necessary to build electrical connection between the polycrystalline silicon patterns 50 of different leaf cell layouts. For instance, the polycrystalline silicon pattern 50 of a transmission gate leaf cell layout TG and connected to an adjacent transmission gate leaf cell layout TG, or the polycrystalline silicon pattern 50 of an inverter leaf cell layout INV are connected to another transmission gate leaf cell layout TG. It is appreciated that the contact via patterns 54 of some leaf cell layouts may be slightly modified in this step wherever necessary for connecting the first-layered metal pattern 56.

Figure 12:
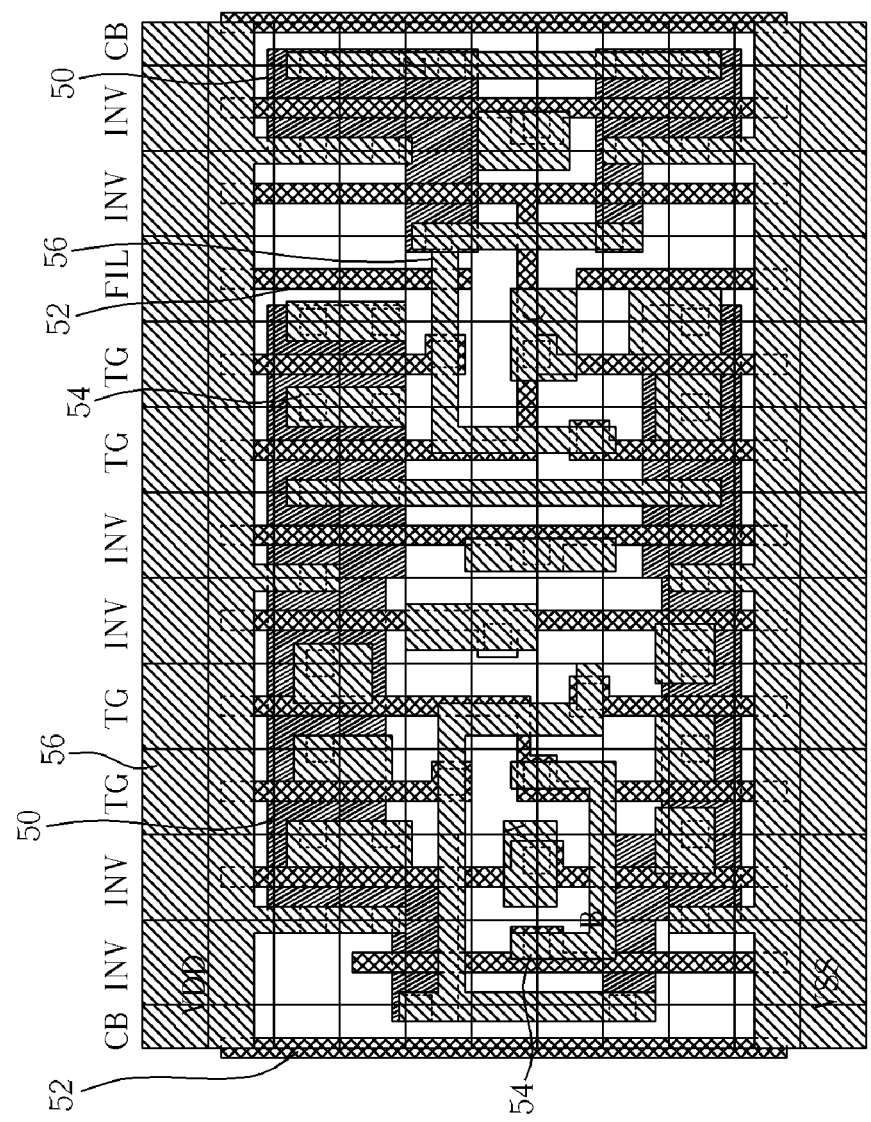
Figure 13:
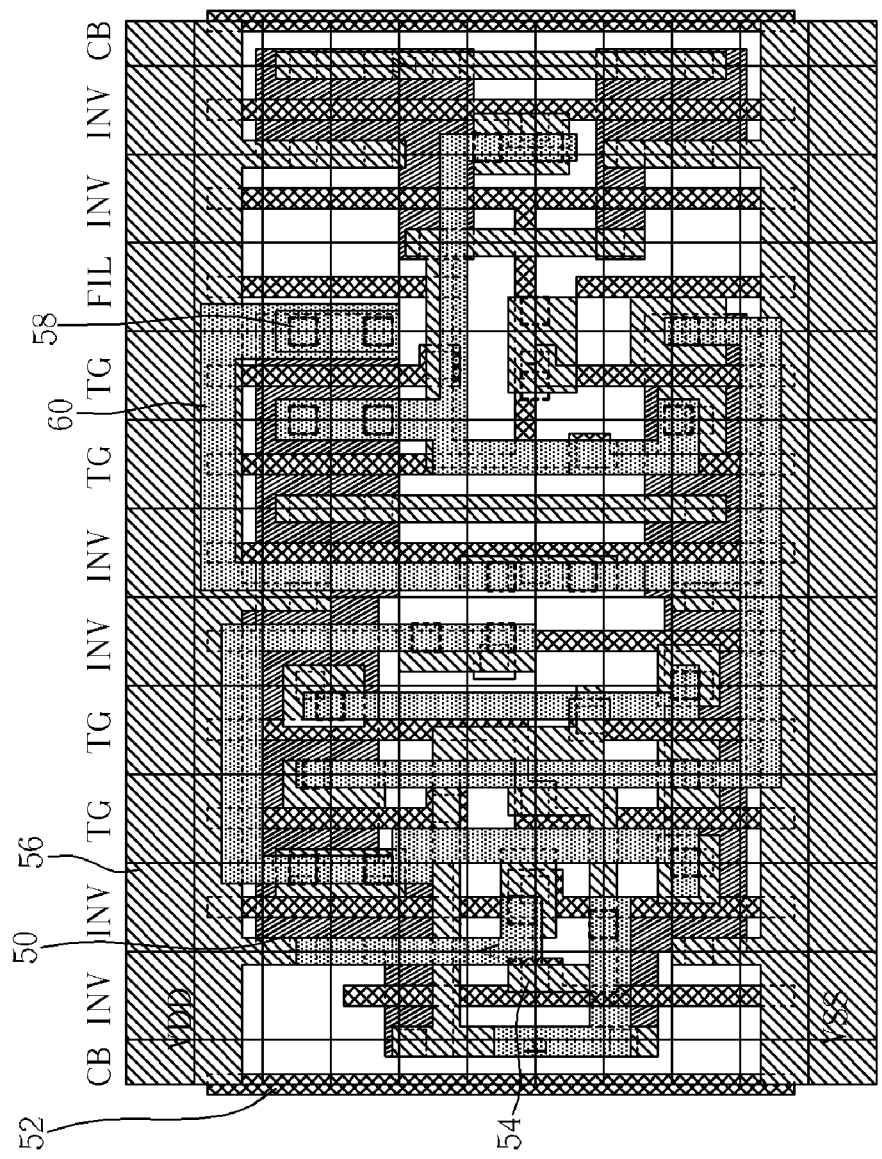

As shown in FIG. 12, M1 routing using the first-layered metal pattern 56 is carried out. As described, the contact via pattern 54 are also modified in accordance with the M1 routing. As shown in FIG. 13, the layout of the multiplexer cell is more complicated, and thus M2 routing which uses another contact via pattern 58 and a second-layered metal pattern 60 is required. Subsequently, DRC and LVS verification are run to complete the layout of the multiplexer cell.

It can be seen from the above embodiments that the method of the present invention uses simple leaf cell layouts combined together to form a complicated standard cell layout, and therefore can reduce layout creation time and create layout more efficiently. In addition to the aforementioned advantages, the method of the present invention is also beneficial because the layout area can be reduced compared to conventional method.

Please refer to FIGS. 14-25. FIGS. 14-25 are schematic diagrams illustrating layouts of different standard cells in comparison with conventional layouts. In FIGS. 14, 16, 18, 20, 22 and 24, each grid of the layout of the present invention has a width of 0.26 microns and a length of 0.2 microns, and in FIGS. 15, 17, 19, 21, 23, 25, each grid of the layout according to the conventional method has a width of 0.2 microns and a length of 0.2 microns.

Figure 14:
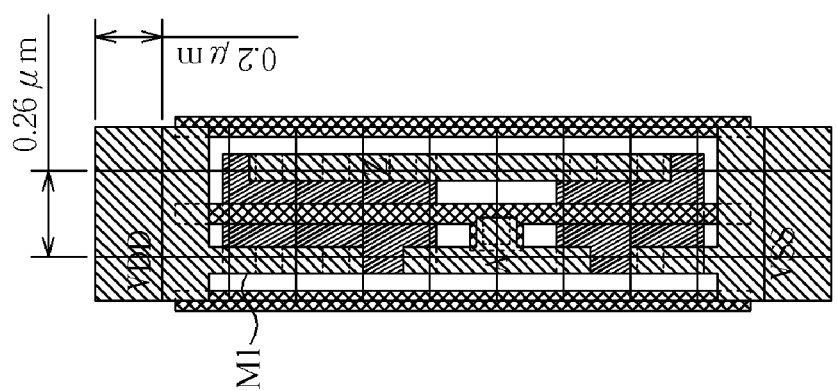
FIGS. 14-25 are schematic diagrams illustrating layouts of different standard cells in comparison with conventional layouts.
Figure 15:
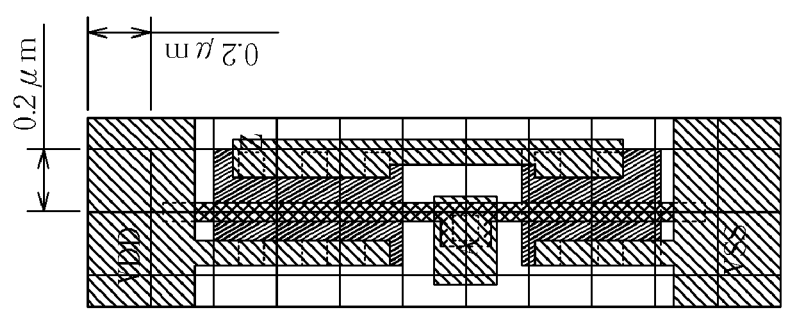

FIG. 14 depicts a layout of an inverter cell of the present invention and FIG. 15 depicts a layout of an inverter cell generated by conventional method. As shown in FIG. 14, the layout of the inverter cell of the present invention occupies 22 grids, and as shown in FIG. 15 the conventional layout of the inverter cell occupies 33 grids. The area of the layout of the present invention is 0.26*0.2*22=1.144, and the area of the conventional layout is 0.2*0.2*33=1.32. Therefore, the layout area of the present invention reduces 13.3%.

Figure 16:
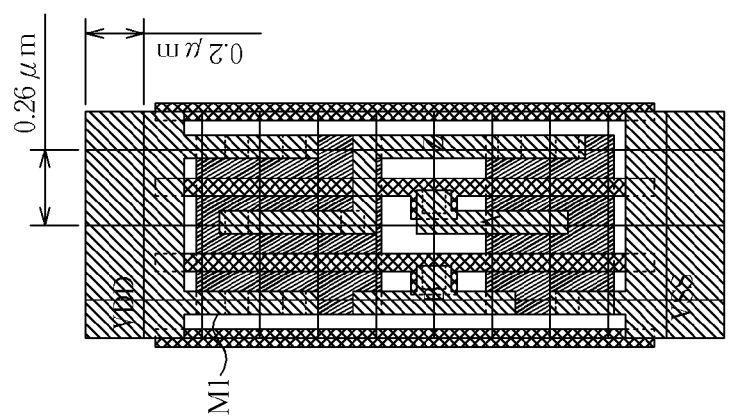
Figure 17:
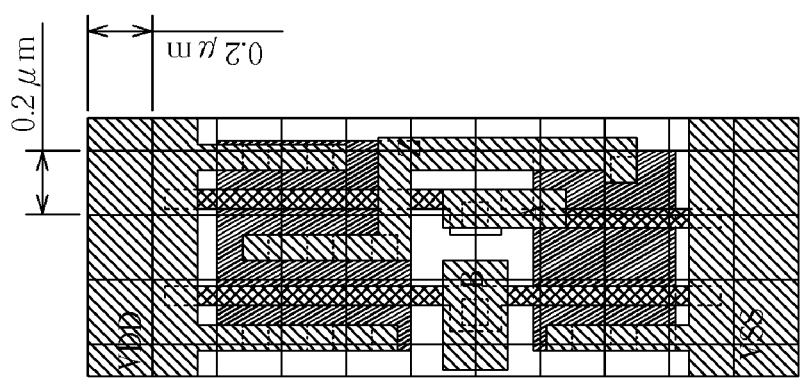

FIG. 16 depicts a layout of a 2 input NAND gate cell of the present invention and FIG. 17 depicts a layout of a 2 input NAND gate cell generated by conventional method. As shown in FIG. 16, the layout of the 2 input NAND gate cell of the present invention occupies 33 grids, and as shown in FIG. 17 the conventional layout of the 2 input NAND gate cell occupies 44 grids. The area of the layout of the present invention is 0.26*0.2*33=1.716, and the area of the conventional layout is 0.2*0.2*44=1.76. Therefore, the layout area of the present invention reduces 2.5%.

Figure 18:
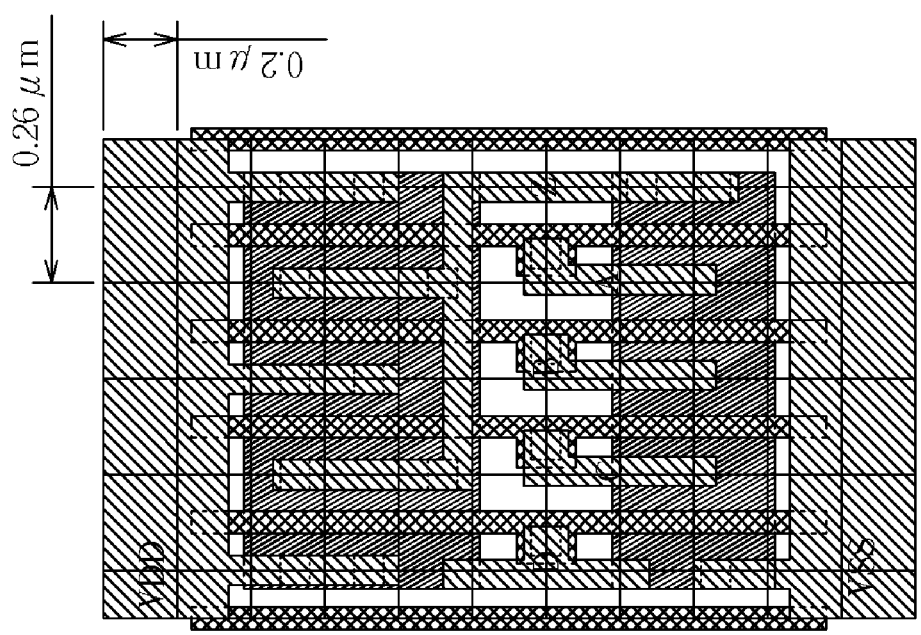
Figure 19:
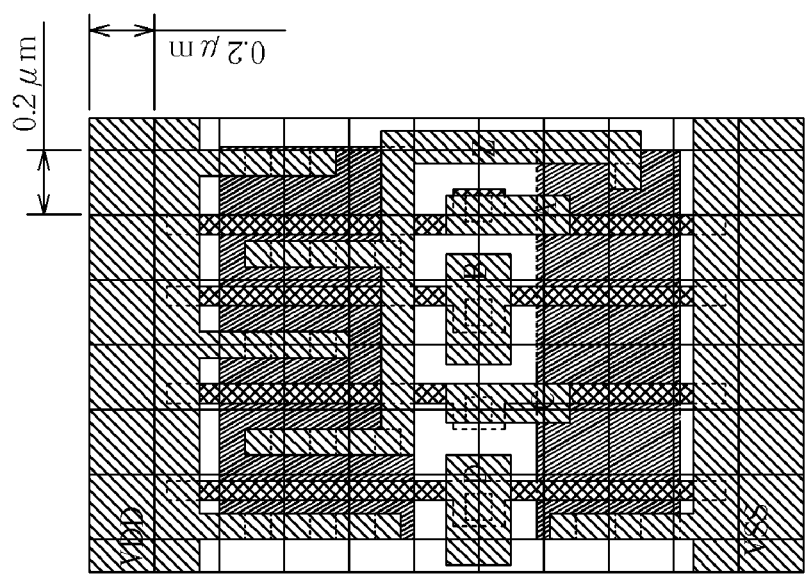

FIG. 18 depicts a layout of a 4 input NAND gate cell of the present invention and FIG. 19 depicts a layout of a 4 input NAND gate cell generated by conventional method. As shown in FIG. 18, the layout of the 4 input NAND gate cell of the present invention occupies 55 grids, and as shown in FIG. 19 the conventional layout of the 4 input NAND gate cell occupies 77 grids. The area of the layout of the present invention is 0.26*0.2*55=2.86, and the area of the conventional layout is 0.2*0.2*77=3.08. Therefore, the layout area of the present invention reduces 7.1%.

Figure 20:
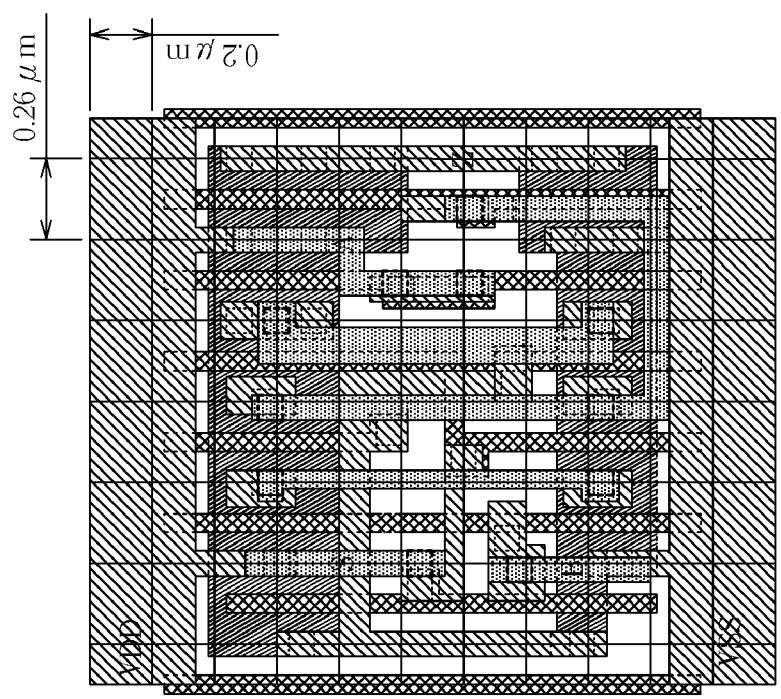
Figure 21:
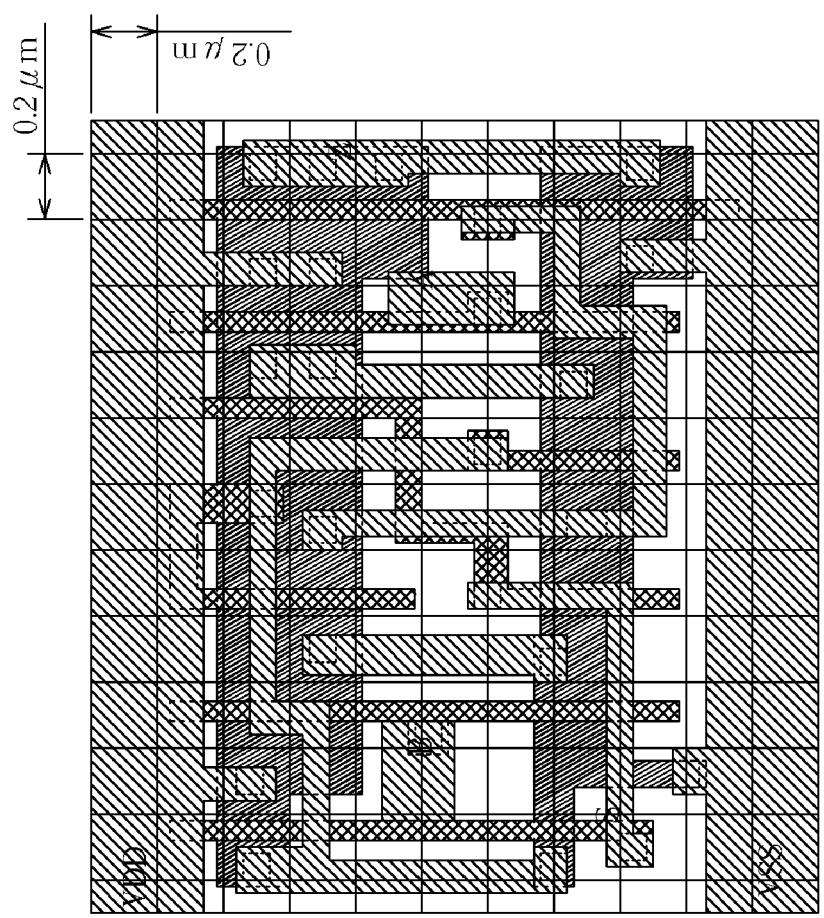

FIG. 20 depicts a layout of a multiplexer cell of the present invention and FIG. 21 depicts a layout of a multiplexer cell generated by conventional method. As shown in FIG. 20, the layout of the multiplexer cell of the present invention occupies 77 grids, and as shown in FIG. 21 the conventional layout of the multiplexer cell occupies 132 grids. The area of the layout of the present invention is 0.26*0.2*77=4.004, and the area of the conventional layout is 0.2*0.2*1 32=5.28. Therefore, the layout area of the present invention reduces 24.2%.

Figure 22:
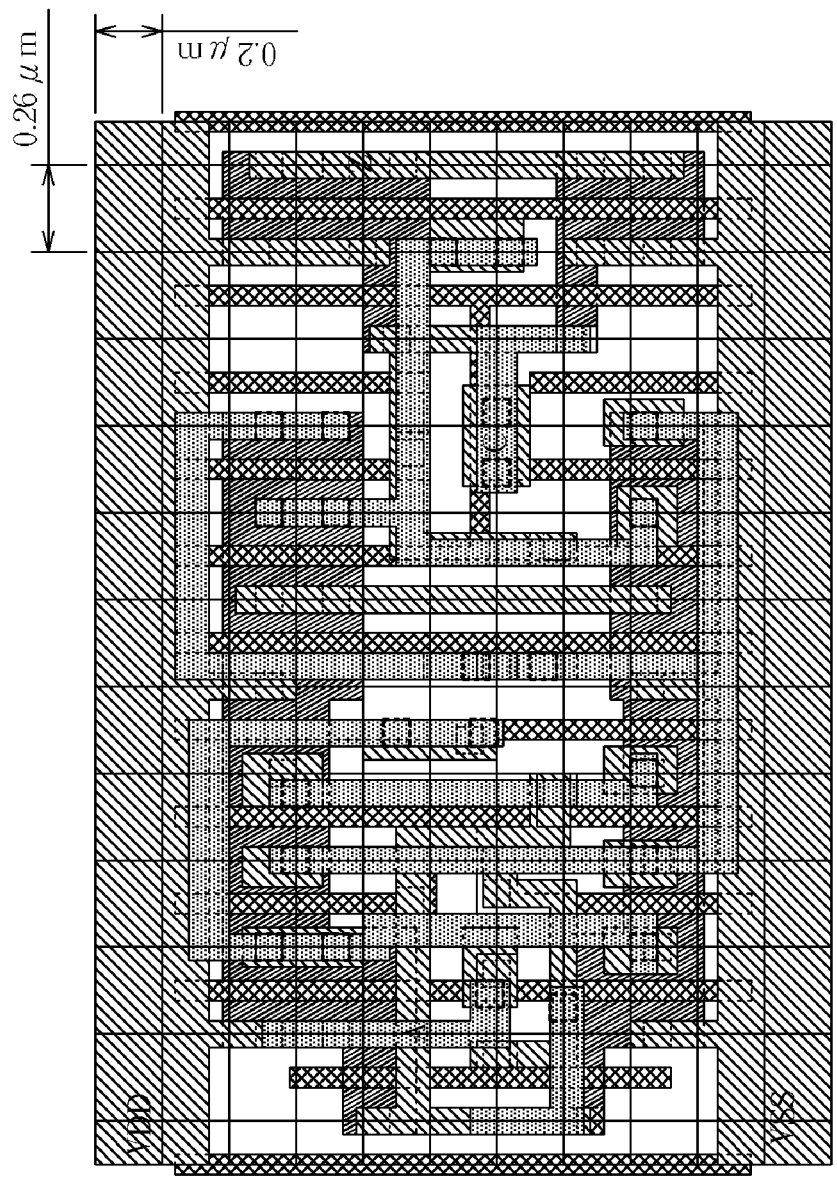
Figure 23:
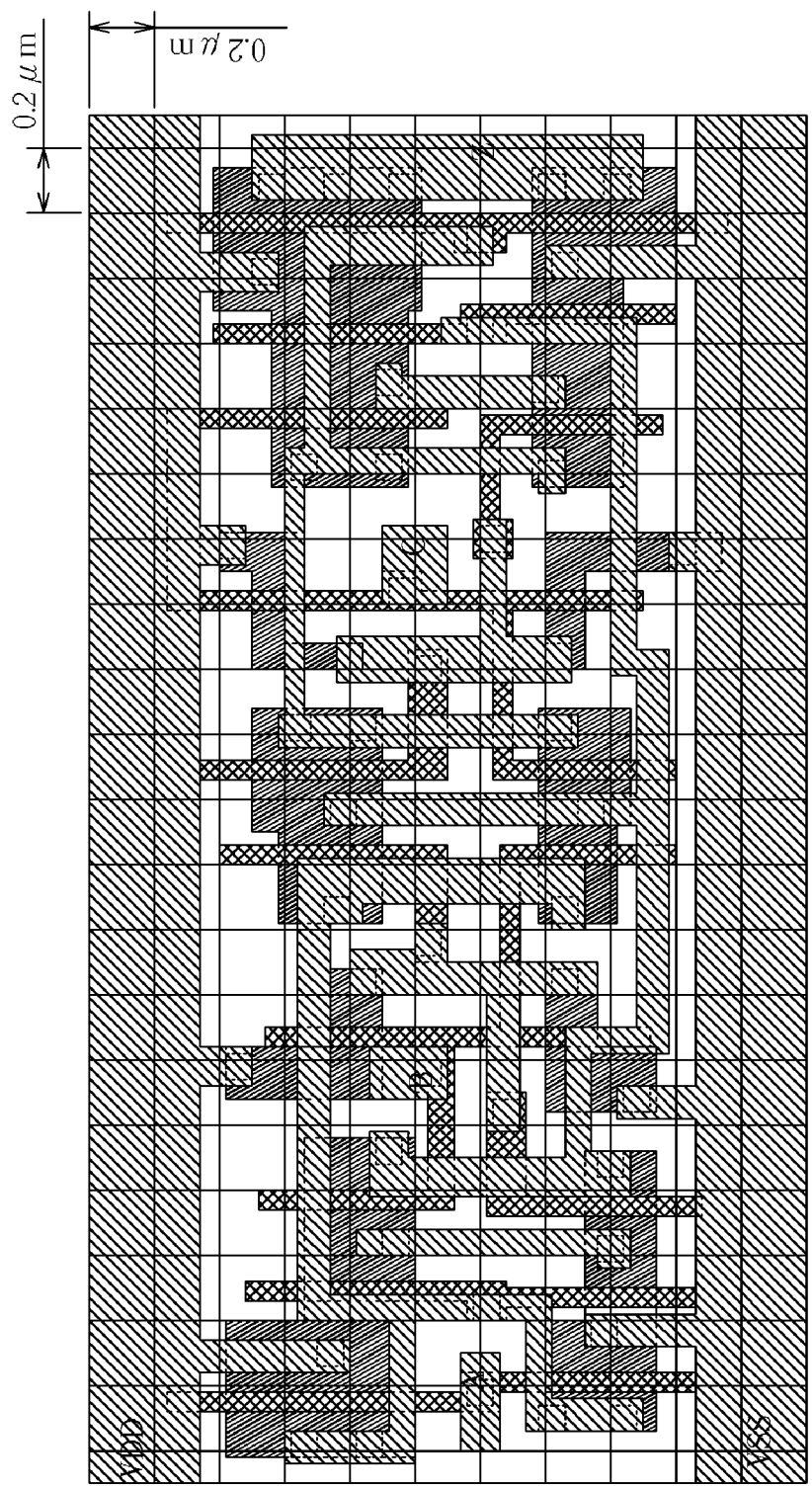

FIG. 22 depicts a layout of an exclusive or (XOR) cell of the present invention and FIG. 23 depicts a layout of an XOR cell generated by conventional method. As shown in FIG. 22, the layout of the XOR cell of the present invention occupies 132 grids, and as shown in FIG. 23 the conventional layout of the XOR cell occupies 231 grids. The area of the layout of the present invention is 0.26*0.2*1 32=6.864, and the area of the conventional layout is 0.2*0.2*231=9.24. Therefore, the layout area of the present invention reduces 25.7%.

Figure 24:
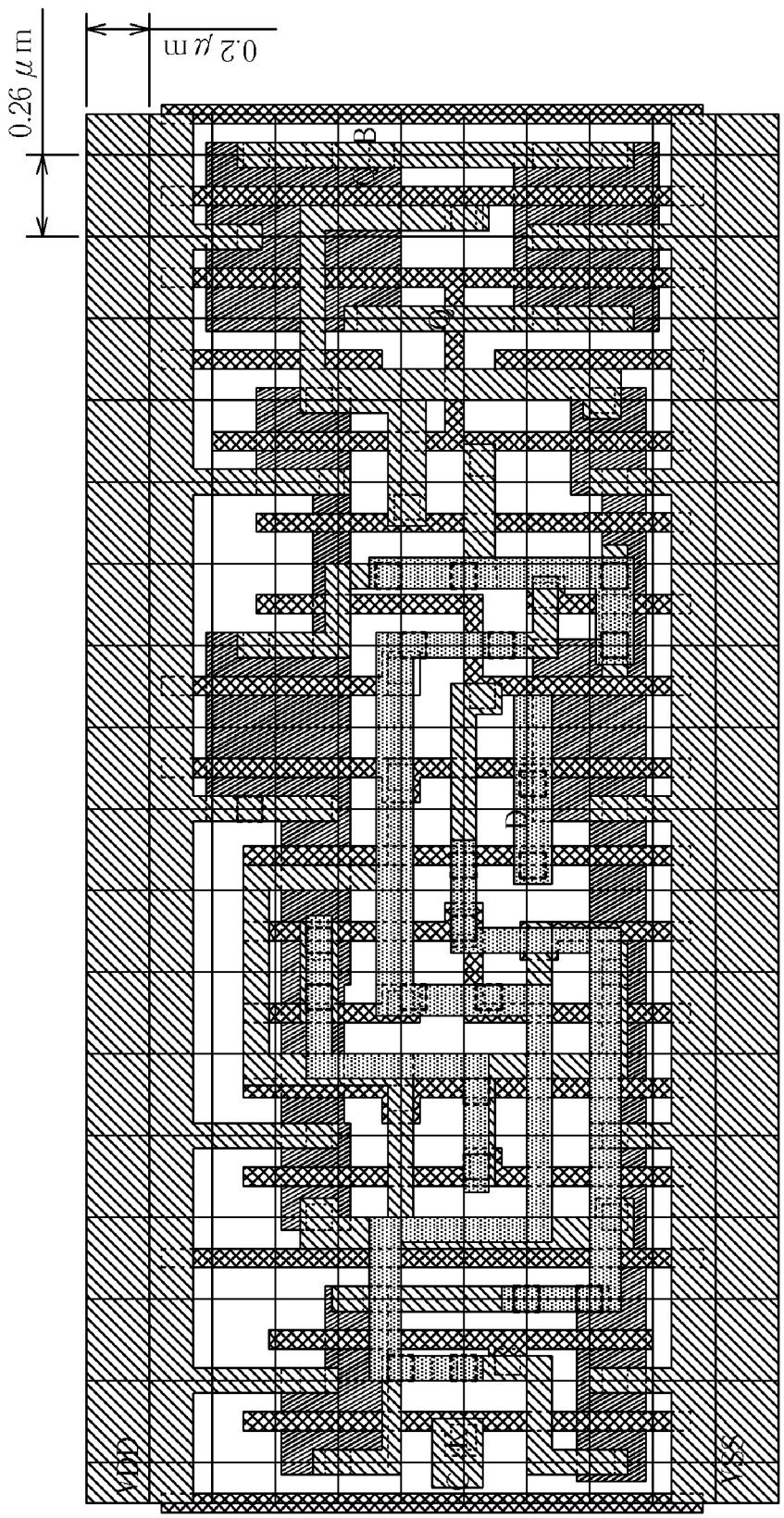
Figure 25:
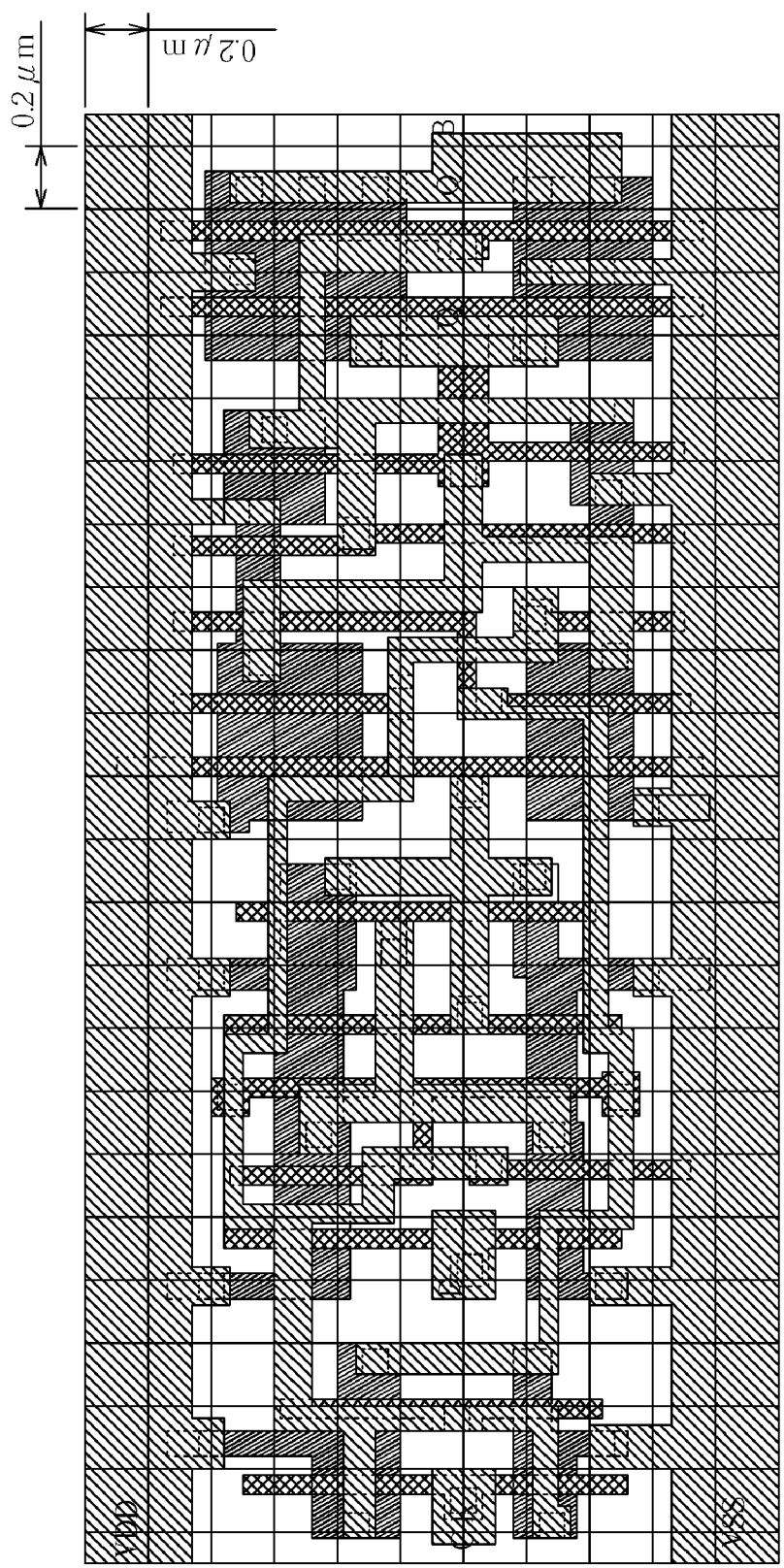

FIG. 24 depicts a layout of a D-flip flop cell of the present invention and FIG. 25 depicts a layout of a D-flip flop cell generated by conventional method. As shown in FIG. 24, the layout of the D-flip flop cell of the present invention occupies 187 grids, and as shown in FIG. 25 the conventional layout of the D-flip flop cell occupies 253 grids. The area of the layout of the present invention is 0.26*0.2*1 87=9.724, and the area of the conventional layout is 0.2*0.2*253=10.12. Therefore, the layout area of the present invention reduces 3.9%.

In summary, the method of the present invention uses a plurality of simple leaf cell layouts to form a complicate standard cell layout, and therefore layout creation time is reduced and layout generation efficiency is improved. In addition, the dimension design of the leaf cell layout of the present invention enables to reduce the completed standard cell layout area in comparison with the standard cell layout generated by conventional method.

Those skilled in the art will readily observe that numerous modifications and alterations of the device and method may be made while retaining the teachings of the invention.

What is claimed is:

1. A method of generating a standard cell layout and transferring the standard cell layout to a substrate, comprising:
   using a computer to execute steps of:
   creating a plurality of leaf cell layouts in a leaf cell layout library;
   analyzing a circuit of the standard cell layout to obtain an analysis result indicating a plurality of leaf cell layouts able to make up the analyzed standard cell layout;
   selecting a plurality of leaf cell layout from the leaf cell layout library according to the analysis result;
   piecing together the leaf cell layouts selected from the leaf cell layout library to generate the standard cell layout;
   wherein each of the leaf cell layout is rectangular having a long axis and a short axis, the leaf cell layouts are arranged along the short axis in a single row, the leaf cell layouts which form the standard cell layout comprises at least one main leaf cell layout and two boundary leaf cell layouts, and a width of the boundary leaf cell layout is substantially half that of the main leaf cell layout; and
   wherein the main leaf cell layout is composed of a plurality of grids, each of the o grids has a width of 0.26 microns, and a length of 0.2 microns; and
   transferring the standard cell layout to the substrate to form an integrated circuit.

2. The method of claim 1, wherein piecing together the selected leaf cell layouts comprising:
   optimizing a placement of the selected leaf cell layouts; and
   abutting the selected leaf cell layouts.

3. The method of claim 1, wherein each of the leaf cell layout comprises a polycrystalline silicon pattern.

4. The method of claim 3, wherein the leaf cell layouts are poly pitch based.

5. The method of claim 4, wherein any two adjacent polycrystalline silicon patterns are substantially equally-spaced along the short axis when the leaf cell layouts are combined.

6. A method of generating a standard cell layout and transferring the standard cell layout to a substrate, comprising:
   using a computer to execute steps of
   creating a plurality of leaf cell layouts in a leaf cell layout library;
   analyzing a circuit of the standard cell layout to obtain an analysis result indicating a plurality of leaf cell layouts able to make up the analyzed standard cell layout;
   selecting a plurality of leaf cell layout from the leaf cell layout library according to the analysis result; and
   piecing together the leaf cell layouts selected from the leaf cell layout library to generate the standard cell layout;
   performing at least a routing process;
   wherein each of the leaf cell layout is rectangular having a long axis and a short axis, the leaf cell layouts are arranged along the short axis in a single row, the leaf cell layouts which form the standard cell layout comprises at least one main leaf cell layout and two boundary leaf cell layouts, and a width of the boundary leaf cell layout is substantially half that of the main leaf cell layout; and wherein the main leaf cell layout is composed of a plurality of grids, each of the grids has a width of 0.26 microns, and a length of 0.2 microns; and transferring the standard cell layout to the substrate to form an integrated circuit.

7. The method of claim 6, wherein piecing together the selected leaf cell layout comprising:

optimizing a placement of the selected leaf cell layouts; and abutting the selected leaf cell layouts.

8. The method of claim 6, wherein each of the leaf cell layout comprises a polycrystalline silicon (poly) pattern.

9. The method of claim 8, wherein the leaf cell layouts are poly pitch based.

10. The method of claim 9, wherein any two adjacent polycrystalline silicon patterns are substantially equally-spaced along the short axis when the leaf cell layouts are combined.

11. The method of claim 8, wherein the routing process comprises a poly routing using the polycrystalline silicon patterns.

12. The method of claim 6, wherein the routing process comprises an M1 routing using a first-layered metal pattern.

13. The method of claim 6, wherein the routing process comprises an M2 routing using a second-layered metal pattern.

* * * * *